US006979217B1

United States Patent
Wang

(10) Patent No.: US 6,979,217 B1
(45) Date of Patent: Dec. 27, 2005

(54) ELECTRICAL CONNECTOR

(75) Inventor: Eric Wang, Taipei Hsien (TW)

(73) Assignee: Advanced Connection Technology Inc., Tapei Hsien (TW)

( * ) Notice: Subject to any disclaimer, the term of this patent is extended or adjusted under 35 U.S.C. 154(b) by 0 days.

(21) Appl. No.: 10/911,632

(22) Filed: Aug. 2, 2004

(51) Int. Cl.[7] .............................................. H01R 13/62
(52) U.S. Cl. ................................................... 439/264
(58) Field of Search ................................ 439/264–266, 439/327–328, 350–358, 330–331, 525–526, 752, 261

(56) References Cited

U.S. PATENT DOCUMENTS

| | | | | |
|---|---|---|---|---|
| 4,846,703 A | * | 7/1989 | Matsuoka et al. ............ 439/71 |
| 5,397,245 A | * | 3/1995 | Roebuck et al. ............ 439/264 |
| 5,468,157 A | * | 11/1995 | Roebuck et al. ............ 439/264 |
| 5,468,158 A | * | 11/1995 | Roebuck et al. ............ 439/264 |
| 6,790,064 B2 | * | 9/2004 | Kajiwara ..................... 439/259 |
| 6,832,919 B2 | * | 12/2004 | Ma et al. ...................... 439/73 |

* cited by examiner

Primary Examiner—J. F. Duverne
(74) Attorney, Agent, or Firm—Darby & Darby

(57) ABSTRACT

An electrical connector includes terminal pieces mounted respectively in mounting holes in a substrate. Each terminal piece has an intermediate portion having a first part connected to a connecting end portion exposed from the respective mounting hole, and a second part connected to a contact end portion opposite to the connecting end portion. A protecting block is disposed adjacent to the substrate, is formed with through holes for permitting extension of the terminal pieces therethrough, respectively, and is operable so as to move from a first position, where the contact end portion of each terminal piece is received in the respective through hole, to a second position, where the contact end portion and the second part of the intermediate portion of each terminal piece are disposed outwardly of the respective through hole and are exposed from the protecting block. A biasing unit biases the protecting block to the first position.

6 Claims, 4 Drawing Sheets

ELECTRICAL CONNECTOR

BACKGROUND OF THE INVENTION

1. Field of the Invention

The invention relates to an electrical connector, more particularly to an electrical connector that can provide a heat-dissipating function.

2. Description of the Related Art FIGS. 1 and 2 illustrate a conventional ZIF electrical connector 100 for connecting a central processing unit (CPU) 21 to a circuit board 22. The conventional electrical connector 100 includes a substrate 10 having opposite top and bottom surfaces 101, 102, and formed with a plurality of mounting holes 11 extending from the top surface 101 to the bottom surface 102, and a set of terminals 13, each of which is mounted in a respective one of the mounting holes 11 and has a contact end portion 133 disposed in the respective one of the mounting holes 11, and a connecting end portion 131 opposite to the contact end portion 131, extending outwardly of the bottom surface 102 of the substrate 10 and connected electrically to the circuit board 22, as shown in FIG. 3. The CPU 21 is formed with a plurality of pins 211, each of which is inserted into a respective one of the mounting holes 11. The pins 211 establish tight electrical contact with the contact end portions 131 of the terminals 13 in the mounting holes 11 upon operating a control rod 14.

However, since the pins 211 of the CPU 21 and the terminals 13 of the conventional ZIF electrical connector 100 are concealed in the mounting holes 11 in the substrate 10, heat generated by the CPU 21 and conducted to the pins 211 is hardly dissipated which can lead to unstable operation of the CPU 21.

SUMMARY OF THE INVENTION

Therefore, the object of the present invention is to provide an electrical connector that facilitates heat-dissipation.

According to the present invention, an electrical connector comprises:

a substrate having first and second surfaces, and formed with a plurality of mounting holes extending from the first surface to the second surface;

a plurality of terminal pieces, each of which is mounted in a respective one of the mounting holes in the substrate and has a connecting end portion exposed from the respective one of the mounting holes at the second surface of the substrate, a contact end portion opposite to the connecting end portion and exposed from the respective one of the mounting holes at the first surface of the substrate, and an intermediate portion having a first part connected to the connecting end portion, and a second part connected to the contact end portion and extending outwardly of the respective one of the mounting holes at the first surface of the substrate;

a protecting block disposed adjacent to the first surface of the substrate, and formed with a plurality of through holes, each of which permits extension of a respective one of the terminal pieces therethrough, the protecting block being operable so as to move from a first position, where the contact end portion of each of the terminal pieces is received in the respective one of the through holes in the protecting block, to a second position, where the contact end portion and the second part of the intermediate portion of each of the terminal pieces are disposed outwardly of the respective one of the through holes and are exposed from the protecting block; and a biasing unit for biasing the protecting block to the first position.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
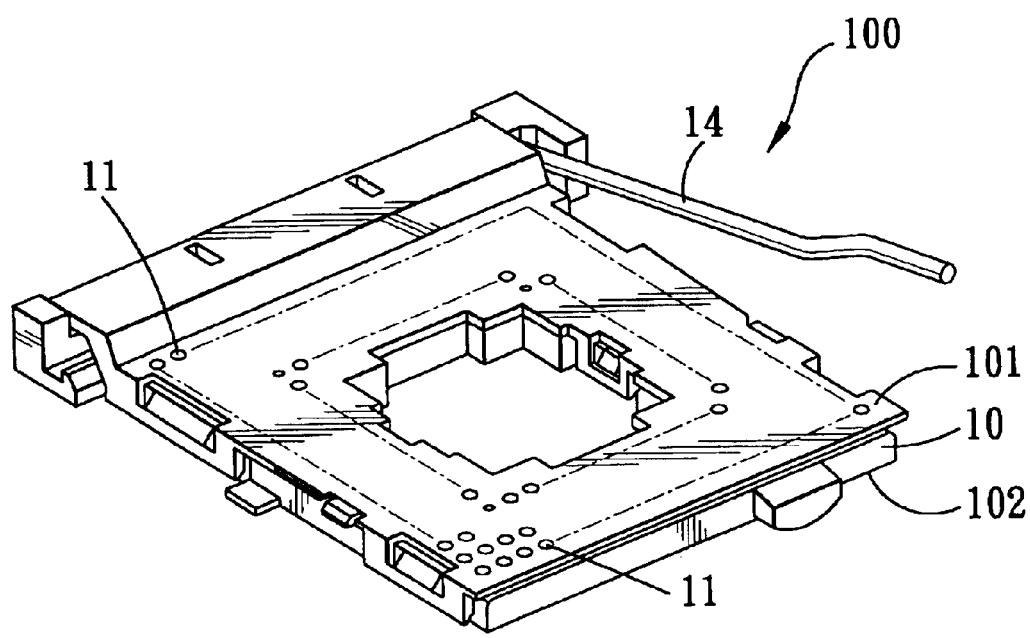
FIG. 1 is a perspective view of a conventional electrical connector.
Figure 2:
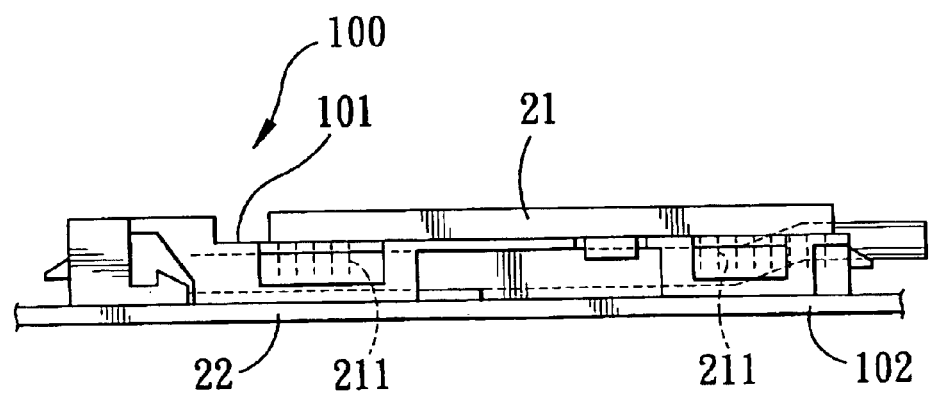
FIG. 2 is a schematic side view showing the conventional electrical connector in a state of use.
Figure 3:
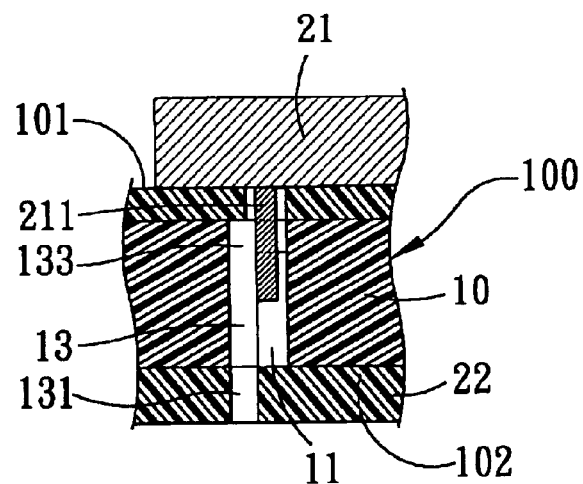
FIG. 3 is a fragmentary schematic sectional view of the conventional electrical connector of FIG. 2.
Figure 4:
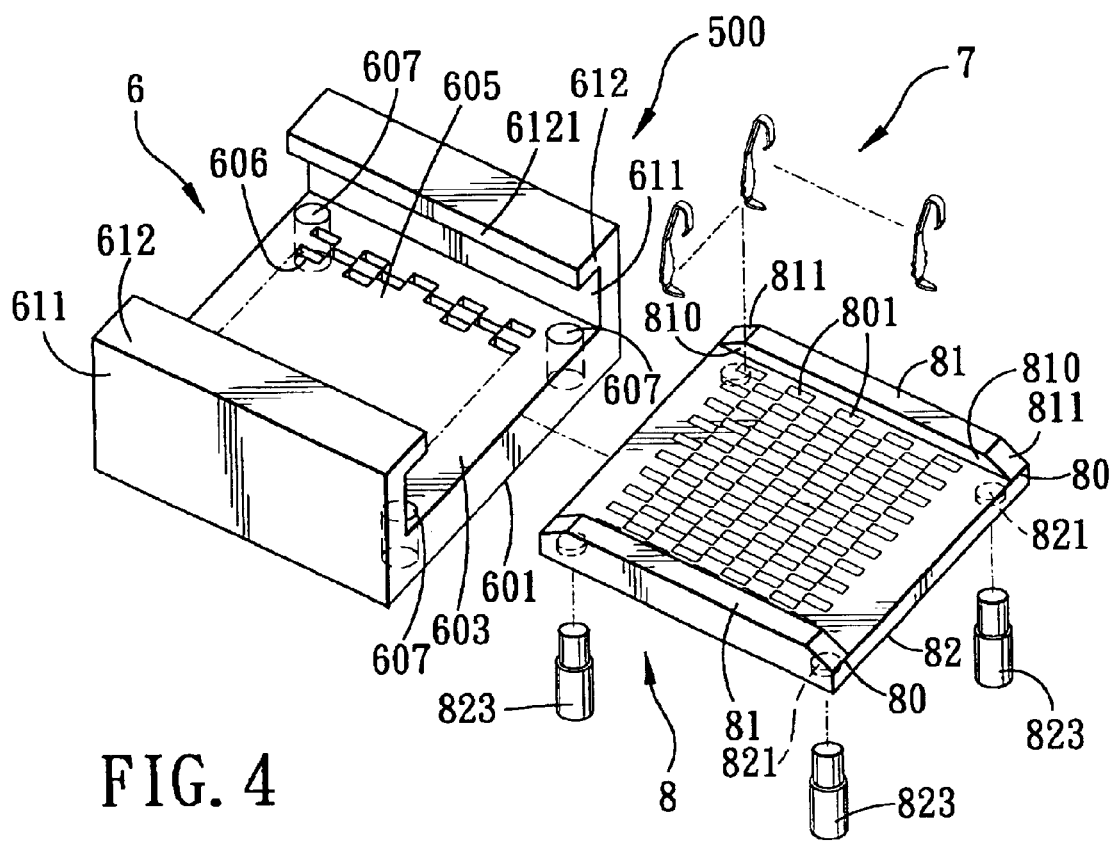
FIG. 4 is an exploded perspective view showing the preferred embodiment of an electrical connector according to the present invention.

Referring to FIG. 4, the preferred embodiment of an electrical connector 500 according to the present invention is shown to include a substrate 6, a plurality of terminal pieces 7, a protecting block 8, and a biasing unit.

The substrate 6 has first and second surfaces, which are respectively opposite top and bottom surfaces 603, 601 in this embodiment, and formed with a plurality of mounting holes 606 extending from the top surface 603 to the bottom surface 601. In this embodiment, the substrate 6 further has opposite lateral walls 611 extending transversely from the top surface 603 and cooperating with the top surface 603 to confine a receiving space 605. Each of the lateral walls 611 has a distal wall part 612 remote from the top surface 603 and formed with a flange 6121 that extends parallel to the top surface 603 and toward the other one of the lateral walls 611. In this embodiment, the top surface 603 is formed with a plurality of first receiving holes 607, as shown in FIG. 4. The bottom surface 601 is adapted to be mounted on a circuit board 90, as shown in FIG. 7.

Figure 5:
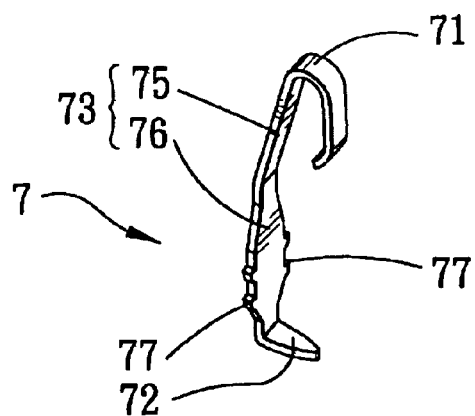
FIG. 5 is a perspective view showing a terminal piece of the preferred embodiment.
Figure 7:
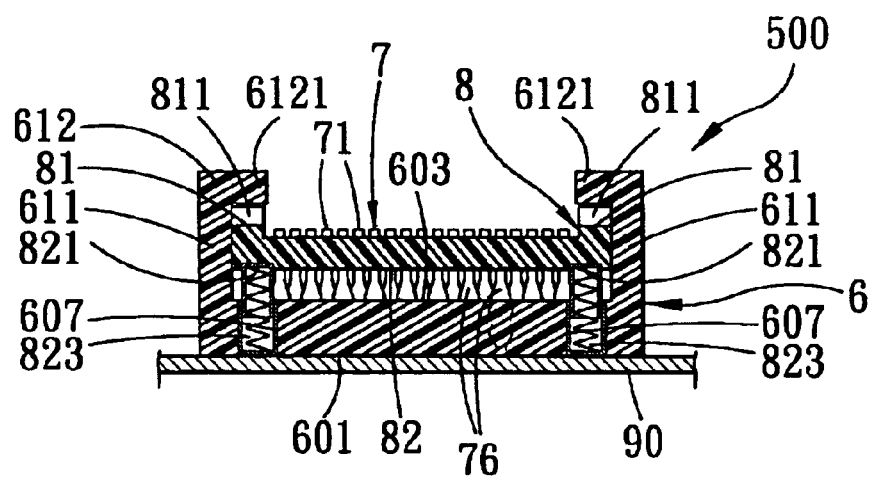
FIG. 7 is a schematic sectional view of the preferred embodiment, taken along line VII—VII in FIG. 6.

Referring to FIG. 5, each terminal piece 7 is mounted in a respective one of the mounting holes 606 in the substrate 6, and has a connecting end portion 72 exposed from the respective one of the mounting holes 606 at the bottom surface 601 of the substrate and adapted to be connected electrically to the circuit board 90 (see FIG. 7), a contact end portion 71 opposite to the connecting end portion 72 and exposed from the respective one of the mounting holes 606 at the top surface 601 of the substrate 6, and an intermediate portion 73 having a lower first part 76 connected to the connecting end portion 72 and formed with a plurality of barbs 77 for engaging the respective one of the mounting holes 606, and an upper second part 75 connected to the contact end portion 71 and extending outwardly of the respective one of the mounting holes 606 at the top surface 603 of the substrate 6 (see FIG. 7).

Figure 8:
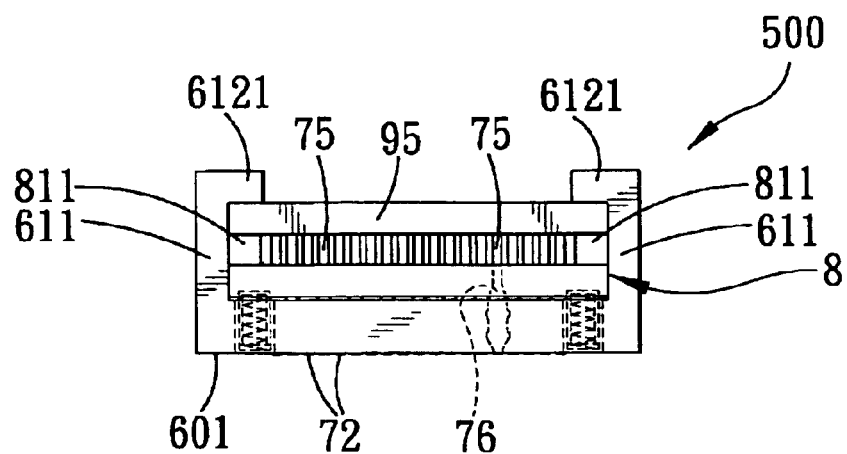
FIG. 8 is a schematic side view showing the preferred embodiment when the protecting block is moved to a second position due to insertion of the heat-generating component.

The protecting block 8, which is disposed movably in the receiving space 605 in this embodiment, is disposed adjacent to the top surface 603 of the substrate 6, and is formed with a plurality of through holes 801, each of which permits extension of a respective one of the terminal pieces 7 therethrough. The protecting block 8 is operable so as to move from a first position, where the contact end portion 71 of each terminal piece 7 is received in the respective one of the through holes 801 in the protecting block 8, as shown in FIG. 7, to a second position, where the contact end portion 71 and the upper second part 75 of the intermediate portion 73 of each terminal piece 7 are disposed outwardly of the respective one of the through holes 801 and are exposed from the protecting block 8, as shown in FIG. 8. In this embodiment, the protecting block 8 has opposite lateral sides 80, each of which is formed with a limit projection 81 that abuts against the flange 6121 on a respective one of the lateral walls 611 of the substrate 6 when the protecting block 8 is disposed at the first position. Preferably, each limit projection 81 has opposite first and second ends 810, each of which is formed with an inclined guiding face 811. In this embodiment, the protecting block 8 has amounting surface 82 facing the top surface 603 of the substrate 6 and formed with a plurality of second receiving holes 821 that correspond to the first receiving holes 607 in the top surface 603 of the substrate 6.

The biasing unit is used for biasing the protecting block 8 to the first position. In this embodiment, the biasing unit includes a set of spring members 823, each of which has opposite ends disposed respectively in a corresponding pair of the first and second receiving holes 607, 821, as shown in FIG. 7.

Figure 6:
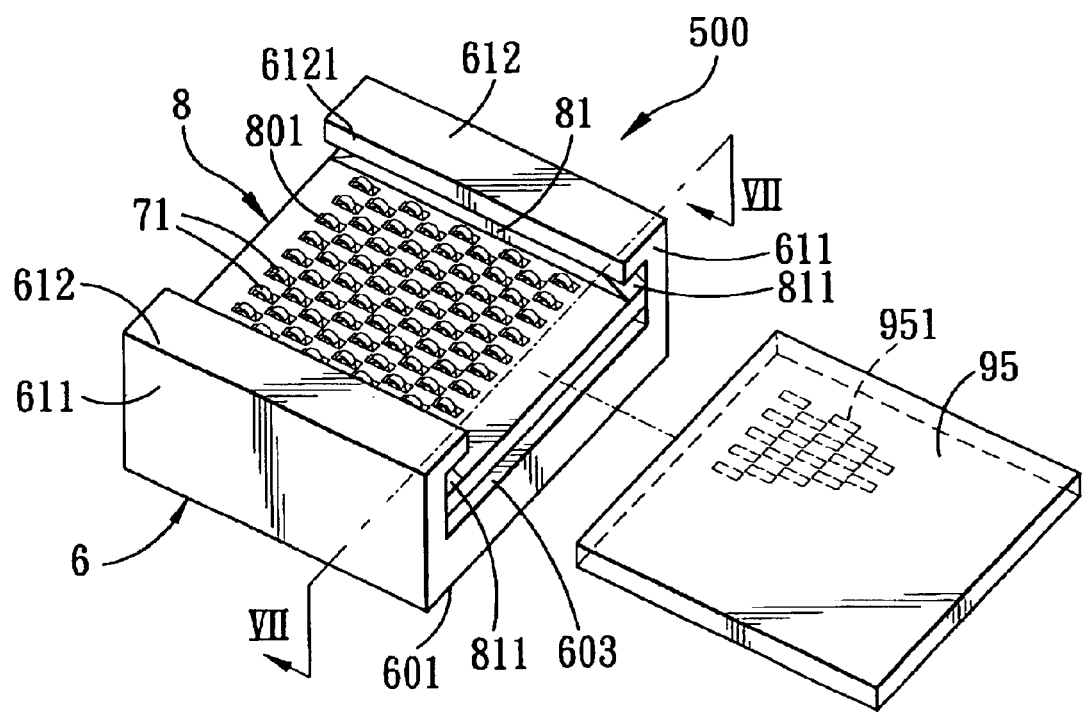
FIG. 6 is a perspective view showing the preferred embodiment when a protecting block of the preferred embodiment is at a first position, and a heat-generating component is to be inserted into the preferred embodiment.

In such a configuration, the electrical connector 500 can be used to connect an electronic device, such as a CPU 95, to the circuit board 9. The CPU 95 is formed with a plurality of contacts 951, as shown in FIG. 6. In use, the CPU 95 is inserted into the receiving space 605 along the inclined guiding faces 811 of the limit projections 81 of the protecting block 8, thereby moving the protecting block 8 from the first position to the second position such that the contact end portions 71 of the terminal pieces 7 are adapted to contact electrically the contacts 951 on the CPU 95, respectively, as shown in FIG. 8.

To sum up, the contact end portions 71 of the terminal pieces 7 are received respectively in the through holes 801 in the protecting block 8 when the protecting block 8 is disposed at the first position such that the contact end portions 71 of the terminal pieces 7 can be protected by the protecting block 8. It is noted that, since the contact end portion 71 and the upper second part 75 of the intermediate portion 73 of each terminal piece 7 are disposed outwardly of the respective one of the through holes 801 and are exposed from the protecting block 8 when the protecting block 8 is disposed at the second position (i.e., the CPU 95 has been inserted into the receiving space 605), heat generated by the CPU 95 can be easily dissipated via the contact end portions 71 and the upper second parts 75 of the intermediate portions 73 of the terminal pieces 7 as a result of circulation of air in the receiving space 605 such that the electrical connector 500 of this invention facilitates heat-dissipation.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. An electrical connector comprising:

a substrate having first and second surfaces, and formed with a plurality of mounting holes extending from said first surface to said second surface;

a plurality of terminal pieces, each of which is mounted in a respective one of said mounting holes in said substrate and has a connecting end portion exposed from the respective one of said mounting holes at said second surface of said substrate, a contact end portion opposite to said connecting end portion and exposed from the respective one of said mounting holes at said first surface of said substrate, and an intermediate portion having a first part connected to said connecting end portion, and a second part connected to said contact end portion and extending outwardly of the respective one of said mounting holes at said first surface of said substrate;

a protecting block disposed adjacent to said first surface of said substrate, and formed with a plurality of through holes, each of which permits extension of a respective one of said terminal pieces therethrough, said protecting block being operable so as to move from a first position, where said contact end portion of each of said terminal pieces is received in the respective one of said through holes in said protecting block, to a second position, where said contact end portion and said second part of said intermediate portion of each of said terminal pieces are disposed outwardly of the respective one of said through holes and are exposed from said protecting block; and a biasing unit for biasing said protecting block to the first position.

2. The electrical connector as claimed in claim 1, wherein said first and second surfaces of said substrate are top and bottom surfaces, respectively.

3. The electrical connector as claimed in claim 1, wherein said substrate further has opposite lateral walls extending transversely from said first surface and cooperating with said first surface to confine a receiving space, said protecting block being disposed movably in said receiving space.

4. The electrical connector as claimed in claim 3, wherein each of said lateral walls has a distal wall part remote from said first surface and formed with a flange that extends parallel to said first surface of said substrate and toward the other one of said lateral walls, said protecting block having opposite lateral sides, each of which is formed with a limit projection that abuts against said flange on a respective one of said lateral walls of said substrate when said protecting block is disposed at the first position.

5. The electrical connector as claimed in claim 4, wherein said limit projection has opposite first and second ends, at least one of which is formed with an inclined guiding face.

6. The electrical connector as claimed in claim 1, wherein said biasing unit includes a set of spring members, said first surface of said substrate being formed with a plurality of first receiving holes, said protecting block having a mounting surface facing said first surface of said substrate and formed with a plurality of second receiving holes corresponding to said first receiving holes, each of said spring members having opposite ends disposed respectively in a corresponding pair of said first and second receiving holes.

* * * * *